(12) United States Patent
Kuhn et al.

(10) Patent No.: US 6,453,445 B1
(45) Date of Patent: Sep. 17, 2002

(54) LARGE SCALE MIXED-SIGNAL INTEGRATED CIRCUIT DESIGN

(75) Inventors: Ray E. Kuhn, Emmaus; Paul R. Sykes, Bethlehem, both of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/033,533

(22) Filed: Mar. 2, 1998

(51) Int. Cl.$^7$ ................................................ G06F 17/50
(52) U.S. Cl. ................................. 716/3; 716/3; 716/11
(58) Field of Search ................................ 716/11, 1–28; 714/726; 708/819; 324/158.1; 370/463; 326/37; 341/139; 703/14, 4, 15; 702/85; 438/510; 323/105, 274, 288; 327/384

(56) References Cited

U.S. PATENT DOCUMENTS 6,263,479 B1 * 7/2001 Tajima ........................ 716/11

* cited by examiner

Primary Examiner—Matthew Smith
Assistant Examiner—Helen Rossoshek

(57) ABSTRACT

A method of shrinking an existing mixed signal IC containing analog and digital circuitry includes the step of first enlarging (growing) the analog circuitry by a first ratio, followed by the step of recombining the enlarged analog circuitry with the existing digital circuitry and, then, optically shrinking the recombined analog and digital circuits by a second ratio. In one embodiment the analog circuits are enlarged by a factor that will offset the subsequent optical shrink. As a result, the analog circuitry is essentially unchanged on silicon, while the digital circuitry will be smaller, thereby making the overall chip smaller.

18 Claims, 2 Drawing Sheets

LARGE SCALE MIXED-SIGNAL INTEGRATED CIRCUIT DESIGN

BACKGROUND OF THE INVENTION

This invention relates to a method for shrinking an existing integrated circuit (IC) design containing analog and digital circuitry and to the fabrication of a resultant IC.

An IC containing both analog and digital circuitry is also defined herein, and in the appended claims, as a "mixed signal" IC. In certain applications, it is desirable and/or necessary to shrink the physical size of the circuitry present on an existing IC to make more chips on the same wafer and/or to enable more circuits to be placed on a chip. Also, reducing the size of a chip, normally increases its production yield. To meet the challenge of shorter cycle (turn-around) times in the fabrication of "shrunken" large scale ICs, it is desirable to re-use the physical design of existing ICs. Optically shrinking an IC design is a fast, effective method of reducing the size of a chip, thereby increasing the yield; where "optically shrinking" refers, generally, to a process of using a smaller size beam to manufacture the various masks levels needed to manufacture an IC.

Digital circuits respond favorably when shrunk optically. In addition to a chip size reduction, the operating characteristics of a digital circuit will often improve with a reduction in size. Digital circuits on a chip can be "optically" shrunk without requiring special treatment. In a digital circuit, speed and power consumption are the main design parameters. It can be shown that in a digital design, speed is directly proportional to $Vdd/L^2$, where Vdd is the circuit's operating voltage, and L is the transistor channel length. When optically shrinking a digital design, the transistor channel length is reduced, thereby increasing the speed parameter. In addition, due to the decrease in the size of the components, including stray and switching capacitances, power consumption is generally reduced. The speed increase and power reduction are very desirable outcomes.

However, shrinking analog circuitry presents a special problem because many analog circuits, such as amplifiers and filters, can not be optically shrunk without adversely affecting critical circuit parameters. By way of example, in analog circuits there are several circuit parameters that a designer must be concerned with. For example, in the case of a differential operational amplifier, some of the most common parameters are gain bandwidth, power supply rejection ratio, common mode rejection ratio, offset and phase margin. These parameters are all influenced by transistor width and channel length and by circuit parasitics such as stray capacitances. Optically shrinking the circuits will change all of these parameters, and it is highly unlikely that all of the circuit parameters would result in an IC meeting the specifications or performing optimally. Therefore, in contrast to digital circuits, most analog circuits when subjected to a straightforward optical shrink will not perform satisfactorily or will fail.

Thus, a significant problem exists when it is desired to shrink a mixed signal IC, since "optically" shrinking the "analog" portion of the IC is not acceptable. As a result, where it is desirable to maintain the functionality and characteristics of the original circuit, it is not possible to shrink a "mixed signal" IC without providing special treatment for the analog portion of the circuit.

SUMMARY OF THE INVENTION

Applicants' invention is directed to a method for shrinking an existing mixed-signal IC such that the "shrunken" IC includes an analog portion whose components are similar in size to those of the original, existing IC and includes a digital portion whose components are smaller in size than those of the original IC. A method of shrinking an existing mixed signal IC, in accordance with the invention, includes the step of first enlarging (growing) the analog circuitry by a first ratio, followed by the step of recombining the enlarged analog circuitry with the existing digital circuitry and, then, optically shrinking the recombined analog and digital circuits by a second ratio.

In one embodiment of the invention, the first and second ratios are selected to ensure that the physical size of the digital circuitry is reduced while the size of the analog circuitry is substantially equal to that of the original, existing, IC. That is, the analog circuits are grown (enlarged) by a factor that will offset the subsequent optical shrink. As a result, the analog circuitry is essentially unchanged on silicon, while the digital circuitry will be smaller, thereby making the overall chip smaller. Therefore, in shrunken ICs embodying the invention, the devices forming the analog circuitry will have similar parameters and characteristics to those of the original IC design and the digital circuitry will generally operate faster and at lower power dissipation.

The enlargement of the analog circuitry and the subsequent shrinking of the combined analog (enlarged) and digital circuitry yields a much shorter cycle time (when migrating a mixed-signal chip to a smaller technology using an optical shrink process) than could be obtained if the analog circuitry were redesigned from scratch.

An existing ("original" or "source") mixed signal IC, when shrunk in accordance with the invention, is used to produce an "object" or "shrunk" IC which includes analog circuits whose components are comparable in size to those of the original, existing, IC and digital circuitry which is shrunken by a predetermined ratio. Thus, in accordance with the invention an "object" mixed signal IC may be produced having analog circuitry which is comparable in size to that of the "original" analog circuitry and having digital circuitry whose size is a predetermined ratio of the "original" circuitry.

BRIEF DESCRIPTION OF THE DRAWINGS

In the accompanying drawings like reference characters denote like components.

DETAILED DESCRIPTION OF THE INVENTION

Figure 1:
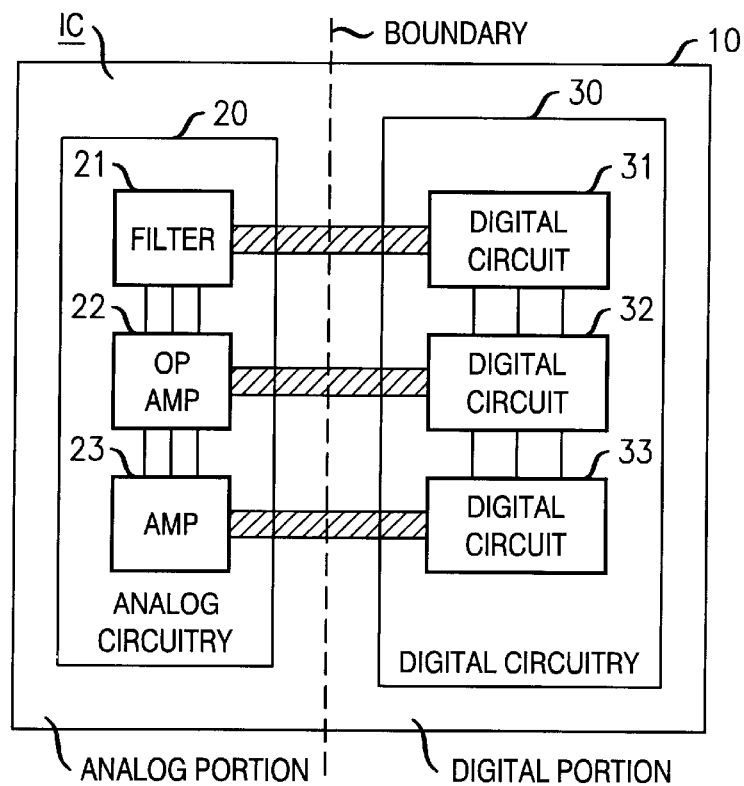
FIG. 1 is a high simplified top view of a mask level of a mixed signal IC showing various blocks of analog and digital circuitry and the interconnections between the blocks.

In the discussion to follow and in the appended claims:
a) The term "source" technology refers to the technology (e.g., 0.35 micron technology) used to design and manufacture the original, existing IC.
b) The term "target" technology refers to the technology (e.g., 0.30 micron technology) used to design and manufacture an IC which is a reduced or shrunken version of the original, existing mixed-signal IC.

c) The "original" mixed signal IC is also referred to as the "existing" or "source" IC and the "shrunken" IC produced from the original IC will also be referred to as the "object" or "target" IC.

In the discussion to follow reference will be made to FIGS. 1, 2 and 3. These figures have not been drawn to scale but are intended to illustrate various stages of the inventive process.

For purpose of this example, it is assumed that the oxide thickness and material resistivity of the target technology are maintained the same as those of the source technology. However, it should be understood that the oxide thickness and material resistivity may be changed.

A method embodying the invention for taking an IC formed in a source technology (e.g., 0.35 micron technology) and shrinking the IC so that an object IC is formed using a target technology (e.g., 0.30 micron technology) is now described.

The data needed to form all the masks of an existing mixed-signal IC may be stored in a suitable computer aided design (CAD) system (not shown). Such a system may be, for example, the Lucent Technologies Graphical Editor (GRED).

An initial step in practicing the invention requires the identification of the analog circuits present on the existing IC. This may be done by operation of the CAD system and or by any other suitable means. Identifying the analog circuitry includes the identification of all the data (for each and every level of the IC) pertaining to all the analog circuits present on the IC.

The data defining the analog circuits is manipulated so as to enlarge (expand or grow) the analog circuits by a first ratio. By way of example, where the digital circuitry is to be eventually shrunk by 10%, the original analog circuitry is first enlarged by 11.1%, so that when the enlarged analog circuitry and the original digital circuitry are subsequently shrunk by 10%, the enlarged analog circuitry will be shrunk to its "original" size while the digital circuitry will end up being shrunk by 10%. For the example of a 10% linear shrink, the original circuitry is enlarged (grown) by 11.1%. Subsequently, the enlarged analog circuitry is recombined with the originally sized digital circuitry and the combination is multiplied by 90%. This produces analog circuitry which is essentially equal, in size, to its original value and digital circuitry which is 90% of its original value. Thus, in this step, the analog circuitry is enlarged by an amount which will compensate for, and offset, a subsequent optical shrink of the enlarged analog data.

The expansion of the data can be accomplished using the CAD system which includes programs for designing linear electrical circuits and for applying a linear grow software algorithm.

Referring to FIG. 1 (which is not drawn to scale), there is shown a top view of a highly simplified level of an "original" or "source" mixed signal IC, 10. [For ease of discussion only one interconnection level is shown. However, it should be understood that the discussion herein, and in the appended claims, applies to each and every level needed to make an IC]. Note that there is shown an analog portion 20 which includes a filter section 21, an operational amplifier section 22, and additional amplification stages 23. There is also shown a digital portion 30 which includes various digital circuits denoted as 31, 32 and 33, which may include memory circuits and a variety of digital control and processing circuits. The various analog subcircuits may be interconnected with each other and to any of the digital subcircuits. Likewise, any of the digital circuits may be interconnected to each other and to any of the analog subcircuits.

Figure 2:
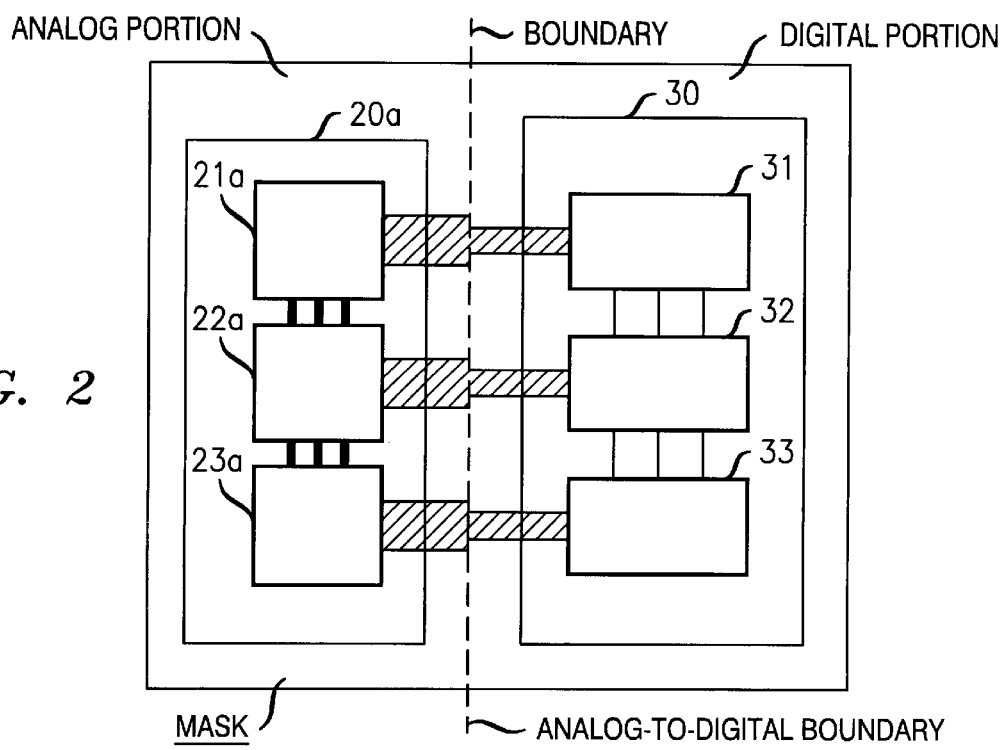
FIG. 2 is a replication of the mask level shown in FIG. 1, showing the enlargement of the analog circuitry and of the analog interconnections, in accordance with the invention.
Figure 3:
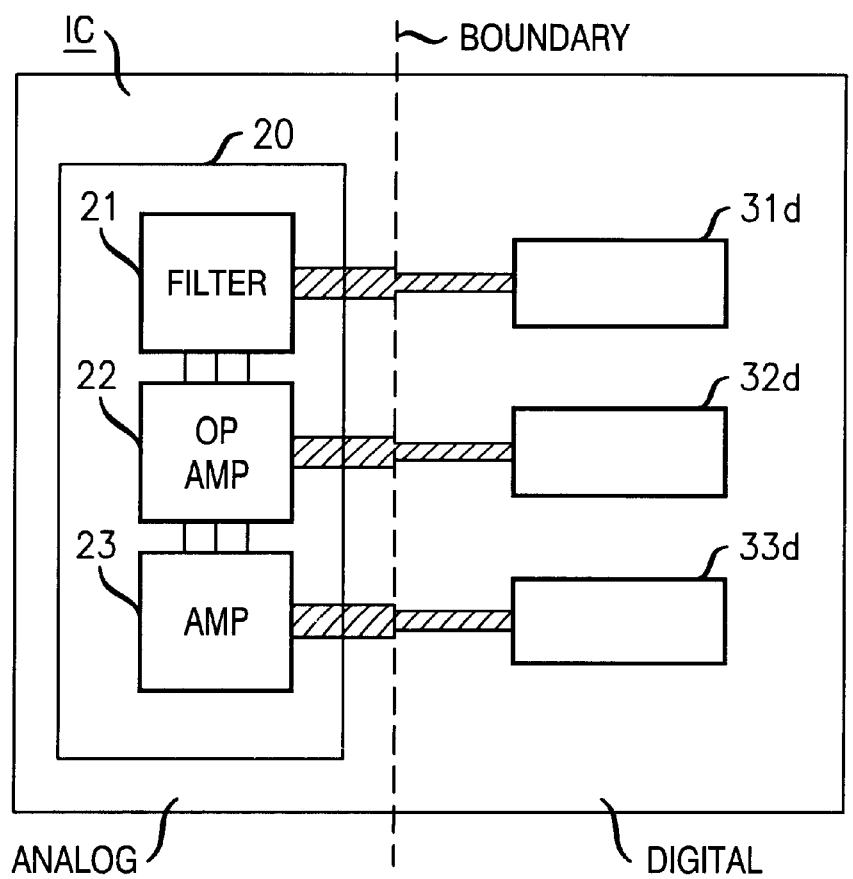
FIG. 3 is a top view of the level shown in FIG. 2 with the enlarged analog circuitry and the original digital circuitry interconnected and shrunk in accordance with the invention.

FIG. 2 (which is also not drawn to scale) illustrates the appearance of the interconnection in the mask level of FIG. 1, and what would be the appearance of the corresponding IC, after the analog circuitry of FIG. 1 is subjected to enlargement. Note that the circuits 21, 22 and 23 are increased by a predetermined ratio (e.g., 11.1%) to produce corresponding circuits 21a, 22a and 23a. Note also that the size of the interconnects between the various analog circuits are increased by the same predetermined ratio. Note still further that the interconnects between the analog circuits and the digital circuits are increased, by the predetermined ratio, in the "analog" portion of the IC extending up to the boundary dividing the analog from the digital portion of the chip. The digital portion of the chip, including its interconnects, on the digital side of the analog to digital boundary remains in its original form.

The expanded version of the analog circuitry is then verified to ascertain that it fits on the chip and that it interconnects properly with the original digital circuitry. This can be done using any design rule checker and electrical connectivity and conductivity checker.

If the enlarged analog circuitry fits on the chip and the interconnection between the analog and digital circuits is operational, the expanded analog circuitry and the original digital circuitry are recombined and the wiring of the components on the chip is maintained or adjusted, if so required. This is done at every mask level using the CAD system, to ensure the integrity of the IC to be manufactured.

The recombined circuitry is verified to ensure proper interconnection (no overlaps of conductive lines and of component parts) and proper placement of the circuitry within the boundaries of the chip. Again, this is done at each mask level using appropriate design rule checkers and electrical circuit verification tools with the CAD system.

If the modified (enlarged) circuit does not fit on the chip, a new floor plan needs to be generated. Likewise, if there is an overlap of one or more circuits due to the expansion of the analog circuitry, a new floor plan may be required, if repositioning of components can not produce the desired results. Generally, the need for a new floor plan is a function of the ratio of the area and amount of analog circuits to digital circuits on the chip. The greater the area of the analog circuitry the more likely will there be a need for a new floor plan. However, even if a new floor plan has to be generated, the savings in turn around time is significant. This is particularly so, where the analog portion of the original mixed signal ICs, subjected to an enlargement and subsequent shrink in accordance with the invention, is not an overwhelming amount of the original IC area.

The expanded analog circuitry and the original digital circuitry is then subjected to an "optical shrink". This may be accomplished in several ways. A way of accomplishing this task, in accordance with the invention, calls for adjusting the size of the beam that is used to "write" the masks. By way of example, the masks may be formed using a Manufacturing Electron Beam Exposure System (MEBES) machine. For the case of a 10% shrink the size of the beam would be "demagnified" or reduced by 10% (e.g., from 0.35 microns to 0.3 microns). FIG. 3 (also not drawn to scale) illustrates the appearance of the mask level (and the appearance of the corresponding IC) shown in FIG. 2 after it is subjected to a shrink of the combined enlarged analog and original digital circuitry. Note that the blocks representing the analog circuits and the interconnections on the analog side of the analog to digital boundary are essentially the same size as those shown in FIG. 1. On the other hand, the size of the digital circuitry and the interconnections on the digital side of the analog-to-digital boundary line are reduced by a predetermined ration (e.g., 10%).

After all the masks are generated, the masks may be used to process a silicon wafer to produce "shrunken" mixed signal ICs, embodying the invention.

It should be understood that in the discussion above when reference was made to a ten percent (10%) shrink when going from a 0.35 micron technology to 0.3 micron technology, such reference was an approximate indication of the intended shrinkage.

Also in the discussion above, shrinkage in the range of 10% was used only by way of example. The exact amount by which an existing IC may be shrunk may be less than 10% or significantly greater than 10%.

Also, as noted above, when indicating that the circuitry of an IC is to be shrunk by N%, what is understood is that the size (i.e., the dimensions) of the circuitry is to be multiplied by a factor of [(100−N)%], where N may be any desired number. For the example of the 10% shrink (i.e., N=10), the recombined circuitry on the IC is multiplied by 90% to effectuate the 10% shrink.

Note also, that in the discussion above, the reference to shrinkage has been to a "linear" shrink in each direction. That is, it should be understood that, unless otherwise limited, a linear shrink in both the "X" and "Y" direction is performed. Thus, for a 10% shrink in both the X and Y directions, the shrinkage in area is equal to 19%. That is, the X and Y dimensions are multiplied by a factor of 90% resulting in the final or object area being 81% of the original area for a 19% decrease.

In some situations, it may be possible to decrease the size of the analog and digital circuitry and then enlarge only the analog circuitry.

What is claimed is:

1. A method for producing a shrunken integrated circuit (IC) from an original mixed signal IC containing analog and digital circuitry comprising the steps of:

identifying the analog circuitry on the original IC and
    enlarging the analog circuitry by a first ratio;
    recombining the enlarged analog circuitry with the original digital circuitry of the original IC; and
    reducing the recombined analog and digital circuitry by a second ratio, and when the enlarged analog circuitry is reduced by the second ratio, the size of the analog circuitry is approximately equal to its original value.

2. A method as claimed in claim 1 wherein the first ratio is selected to have a value such that when the enlarged analog circuitry is reduced by the second ratio, the size of the analog circuitry is approximately equal to its original value.

3. A method as claimed in claim 1 wherein said step for reducing the recombined analog and digital circuitry by a second ratio includes an optical shrink.

4. A method as claimed in claim 1 wherein said method is for producing the masks to manufacture said shrunken IC and wherein the step of identifying the analog circuitry on the original IC and enlarging the analog circuitry by a first ratio includes the step of enlarging the data pertaining to each mask level forming the original IC.

5. A method as claimed in claim 1 wherein the step of recombining the enlarged analog circuitry with the original digital circuitry includes the step of verifying that the enlarged analog circuit and the original digital circuitry fit on the IC.

6. A method as claimed in claim 5 wherein the step of recombining the enlarged analog circuitry with the original digital circuitry includes the step of verifying the interconnections between the enlarged analog circuitry and the original digital circuitry.

7. A method as claimed in claim 1 wherein the step of reducing the recombined analog and digital circuitry by a second ratio includes reducing the beam size of a device for forming the masks of the reduced IC.

8. A method of reducing the size of an original mixed signal IC, containing analog and digital circuitry, to form a new shrunken IC comprising the steps of:

identifying the analog circuitry on the original IC and
    enlarging the analog circuitry by a first ratio;
    recombining the enlarged analog circuitry with the original digital circuitry; and
    reducing the recombined analog and digital circuitry by a second ratio using an optical shrink, and when the enlarged analog circuitry is reduced by the second ratio, the size of the analog circuitry is approximately equal to its original value.

9. An object mixed-signal integrated circuit (IC) having analog and digital circuits formed from a source mixed-signal IC having analog circuitry and digital circuitry, comprising:

the analog circuitry of said object IC being formed to be of similar size to the analog circuitry of the source IC, when after an enlarged analog circuitry is reduced by a predetermined ratio, and the size of the digital portion of said object IC being formed by optically reducing, by said predetermined ratio, the size of the digital circuitry of said source IC; and
    the digital and analog circuitry of said object IC performing substantially the same functions performed by the analog and digital circuitry of said source IC.

10. Apparatus for producing an object integrated circuit (IC) containing analog and digital circuitry derived from an original mixed signal integrated circuit (IC) having analog and digital circuits comprising:

means for identifying and enlarging the analog circuitry on the original IC by a first ratio;
    means for recombining the enlarged analog circuitry with the original digital circuitry; and
    means for optically reducing the recombined analog and digital circuitry by a second ratio for enabling the production of masks for the manufacture of said object IC, and when the enlarged analog circuitry is reduced by the second ratio, the size of the analog circuitry is approximately equal to its original value.

11. An apparatus as claimed in claim 10 wherein the first ratio is selected to have a value such that when the enlarged analog circuitry is reduced by the second ratio, the size of the analog circuitry is approximately equal to its original value.

12. An apparatus as claimed in claim 10 wherein said apparatus is for enabling the production of masks for the manufacture of said object IC; and wherein the means for identifying the analog circuitry on the original IC and enlarging the analog circuitry by a first ratio includes means for enlarging the data pertaining to each mask level forming the original IC.

13. An apparatus as claimed in claim 10 wherein the means for recombining the enlarged analog circuitry with the original digital circuitry includes means for verifying the enlarged analog circuit and the original digital circuitry fit on the IC.

14. An apparatus as claimed in claim 13 wherein the means for recombining the enlarged analog circuitry with the original digital circuitry includes means for verifying the interconnections between the enlarged analog circuitry and the original digital circuitry.

15. An apparatus as claimed in claim 10 wherein the means for reducing the recombined analog and digital circuitry by a second ratio includes means for reducing the beam size of a manufacturing system for forming the masks of the reduced IC.

16. An object mixed-signal integrated circuit (IC) having analog and digital circuits formed from a source mixed-signal IC having analog circuitry and digital circuitry, comprising:

the analog circuitry of said object IC being formed to be of similar size to the analog circuitry of the source IC, when after an enlarged analog circuitry is reduced by a predetermined ratio, and the size of the digital portion of said object IC being reduced by said predetermined ratio so as to be a shrunken version of the digital circuitry of said source IC; and the digital and analog circuitry of said object IC performing substantially the same functions performed by the analog and digital circuitry of said source IC.

17. Apparatus for producing an object integrated circuit (IC) containing analog and digital circuitry derived from an original mixed signal integrated circuit (IC) having analog and digital circuits comprising:

means for reducing the combined analog and digital circuitry of said original IC by a predetermined ratio; and means for identifying and enlarging the reduced analog circuitry by a second predetermined ratio to cause the analog circuitry of the object IC to be of similar size as the analog circuitry of the original IC.

18. A method for producing a shrunken integrated circuit (IC) from an original mixed signal IC containing analog and digital circuitry comprising the steps of:

reducing the combined analog and digital circuitry by a first ratio; and enlarging the analog circuitry by a second ratio so that the analog circuitry on the shrunk IC is of the same or similar size as the analog circuitry on the original IC.

* * * * *